Figure 1:
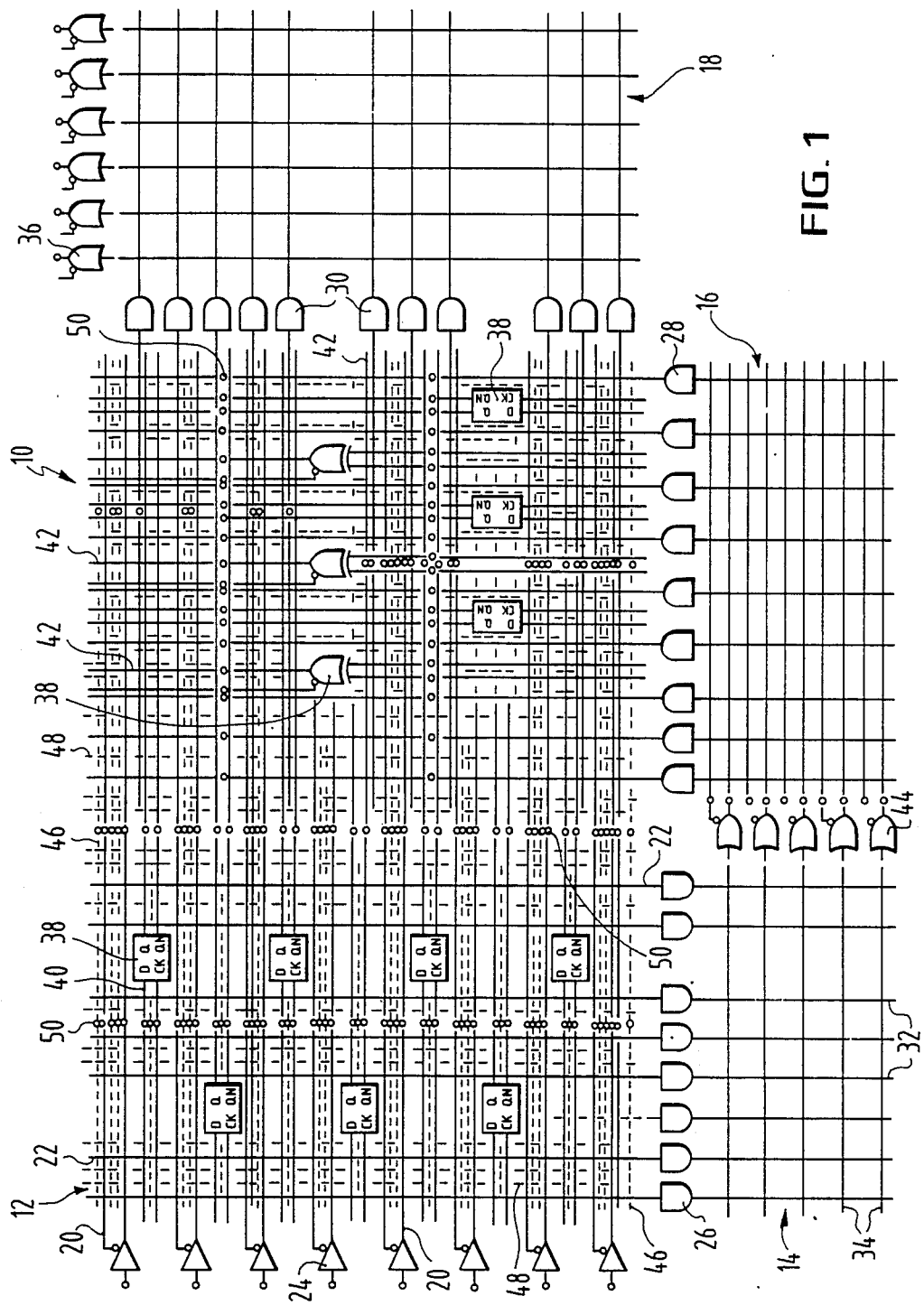

United States Patent [19]

Brockmann

[11] Patent Number: 4,689,654
[45] Date of Patent: Aug. 25, 1987

[54] LOGIC ARRAY CHIP

[75] Inventor: Werner Brockmann, Altenbeken, Fed. Rep. of Germany

[73] Assignee: Nixdorf Computer AG, Fed. Rep. of Germany

[21] Appl. No.: 853,017

[22] Filed: Apr. 17, 1986

[30] Foreign Application Priority Data

Apr. 19, 1985 [DE] Fed. Rep. of Germany ....... 3514266

[51] Int. Cl.[4] ..................... H01L 27/10; H03K 19/00; G11C 17/00
[52] U.S. Cl. ........................................ 357/45; 357/68; 357/71; 357/40; 307/465; 307/466; 307/467; 307/468; 307/469; 365/103; 365/104; 365/105
[58] Field of Search ..................... 357/45, 68, 40, 71; 365/103, 104, 105; 307/465, 466, 468, 469, 467

[56] References Cited

U.S. PATENT DOCUMENTS 4,534,008  8/1985  Fuchs et al. ................... 307/465
4,617,649 10/1986  Kyomasu et al. .............. 365/104
4,644,192  2/1987  Fisher ........................... 307/465

FOREIGN PATENT DOCUMENTS 57-20447   2/1982  Japan ............................. 357/45
57-111044  7/1982  Japan ............................. 357/45
59-55045   3/1984  Japan ............................. 357/45
59-66145   4/1984  Japan ............................. 357/45

Primary Examiner—Martin H. Edlow
Assistant Examiner—Jerome Jackson
Attorney, Agent, or Firm—Harness, Dickey & Pierce

[57] ABSTRACT

A programmable logic array chip is provided with an auxiliary grid pattern of conductive paths. Connecting elements can be selectively activated to connect certain ones of the auxiliary paths to the normal grid pattern paths which are connected to functional elements. In such manner, it is possible to provide a logic array chip that has increased flexibility in terms of user programmable functions.

8 Claims, 4 Drawing Figures

LOGIC ARRAY CHIP

The invention involves a logic-array chip, manufactured using integrated technology, for the production of integrated logic circuits, having a substrate on which a conductive path area is formed by grid-like crossing conductive paths that lead to functional elements located outside the conductive path area, and which can be linked at their cross-over points by means of linking elements which can be activated or deactivated and which, depending on the logical status of a conductive path, affect the logical status of a crossing conductive path in such a way that logical operations may be performed on the crossing conductive paths.

Chips with linkage areas, or logic arrays, for the generation of logical circuits are known to exist in various versions. For additional information on the conventional structure and state of the art of these chips known as Programmable Logic Arrays (PLA), or Programmable Array Logic (PAL), reference is made, e.g., to "Integrated Programmable Logic Circuits", a data manual by Valvo, 1984, Publishers Boysen & Masch, Hamburg, and to "PAL Handbook", a data manual by Monolithic Memories, Inc., 1983, Santa Clara, U.S.A.

The array structure of these linkage areas offers the advantage that within them, any imaginable Boolean operation among input values can be performed, if required, also with feedback signals. Its programming capability allows the adaptation of the integrated circuit to the specific task, after the integrated circuit is completely finished (with electrical programming) or, at least, almost completely finished. It is therefore possible to produce chips of the earlier-mentioned type in large numbers, as well as cost-effectively, even when only a small number of chips are required for a defined, customer-specific order. The specification for the circuit of the specific task is supported by software tools based on a logical description.

Programming can be accomplished with the help of masks during the finishing of the chip, or afterwards, for example through the effects of a laser beam on the chip of, preferably, by electrical means. Therefore, integrated circuits for specific functions can be manufactured very quickly, sometimes with the help of programming devices.

The conversion of logical functions within an array structure occurs by means of a combined arrangement of an AND and an OR array. Preferably, this is done using WIRED-AND, WIRED-OR, WIRED-NOR or WIRED-NAND operations in these arrays, possibly under application of transistors, field-effect transistors or diodes as linking elements, sometimes in connection with so-called PULL-UP or PULL-DOWN elements in a suitable arrangement. Based on the Boolean equivalence rule, this allows the plotting of AND and OR functions also through NAND or NOR functions by means of inversion.

The linking elements are found at the cross-over points of the conductive paths and can be activated or deactivated by one of the above described methods, so that, depending upon the controlling conductive path, they may or may not affect the logical status of the associated crossing conductive path, for the purpose of a logical operation.

Those functional elements located outside of the conductive path area, preferably those on the edge of the substrate, generally are storage elements or registers, and input or output circuits. The number of functional elements is set for each type of integrated logic array. Their function can be made programmable if required.

These substantial advantages of the PLA chip, such as variability and short development time for circuit conversion, are offset by a few drawbacks or limitations. The principle of a two-level construction leads to limited complexity. To overcome this shortcoming, for example, provisions for feedback and the like are added. But, in general, this leads to redundancies, which not only occupy substrate surface area no longer otherwise usable, but, due to longer lines, also reduce the processing speed. The required substrate surface area, however, largely influences the manufacturing cost of the circuit chip.

The invention is based on the task to create a logic-array chip of the earlier mentioned type that, because of its regular construction, can be pre-fabricated at least to a degree and, with a minimum of time and financial effort, facilitates the production of a large variety of integrated circuits.

The task is solved by this invention in such a way that, within the conductive path area, at least one functionally free conductive path, parallel to the column and/or row direction, is provided, which is not permanently allocated to specific functional elements outside of the conductive path area and which, at least at one cross-over point, is connected through a connecting element and, at least at one further cross-over point, is connected or linked through a connecting element or a linking element, with its crossing conductive path, whereby the connecting elements are so constructed that they transmit the logical status of a conductive path to its crossing conductive path, without effecting a logical operation on it.

The free conductive paths provide the possibility, either to interconnect functional blocks formed within the conductive path area or to form through feedback of generated signals within the conductive path area, more complex structures in which the generated signals can also make multiple passes through specific functional blocks. Multiple free conductive paths located in the conductive path area, are preferably arranged in a matrix pattern.

The flexibility of this arrangement can be greatly expanded, if within the conductive path area (viewed perpendicularly to the substrate surface), at least one more functional element, which can be connected to a conductive path, is provided to perform logical partial functions. The functional elements may be arranged within the conductive path area, in columns and/or rows, in which case the functional elements of adjacent columns or rows preferably are staggered in the column or row direction, so that the conductive tracks leading to the individual functional elements cannot be interfered with by adjacent functional elements.

The variability of the chip can be further expanded, if at least one conductive path is equipped with at least one interfacing point located between two cross-over points, at which the conductive path can be opened or, at which conductive path segments can be interconnected. In combination with the free conductive paths and other functional elements located within the conductive path area, such as storage elements, complex circuits can also be generated, without the need to prepare special masks as is the case with gate arrays or integrated circuits made of standard cells. Because the outputs of the functional elements incorporated in the conductive path area can be jointly linked, the number of required feedbacks is substantially lower than with conventional integrated circuits.

Unlike most integrated circuits known to date which, with their more complex configuration, contain different arrangements, as for example, several standard cells and/or separately hard-wired individual circuits, the chip of this invention presents an essentially uniform structure, despite the possibility of creating rather complicated and complex circuits.

Because of the interface points, multiple linkage areas can be formed with associated functional elements, on the substrate within the conductive path area, in order to achieve more complex structures. The linkage areas on the substrate can be arranged in matrix form where, in at least one row and/or column of linkage areas, additional functional elements can be provided between two linkage areas.

Due to another feature of the invention, at least one interface point can be formed by a connecting element which, like all other connecting elements, can be of the unidirectional, bidirectional, signal-boosting or signal-regenerating, or also of the inverting type.

The chip per this invention allows the fabrication of complex circuits while featuring a rather regular construction of the conductive path area. The circuit components provided on this chip allow the generation of a multitude of integrated circuits, so that the chip of this invention permits the low-cost manufacture of integrated circuits in small quantities, because the versatile base chip can be produced in large, cost-reducing quantities. Furthermore, the chip of this invention not only allows cost savings for small quantities, but it can also substantially lower the production time for special integrated circuits. Furthermore, the chip per this invention is upward compatible with conventional PLA chips.

Figure 2:
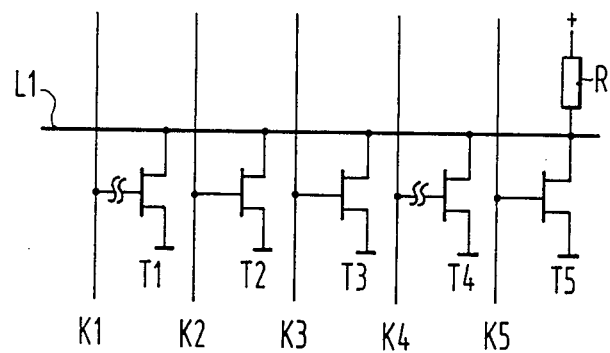
Figure 3:
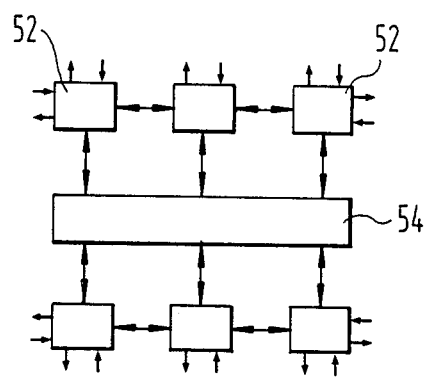
Figure 4:
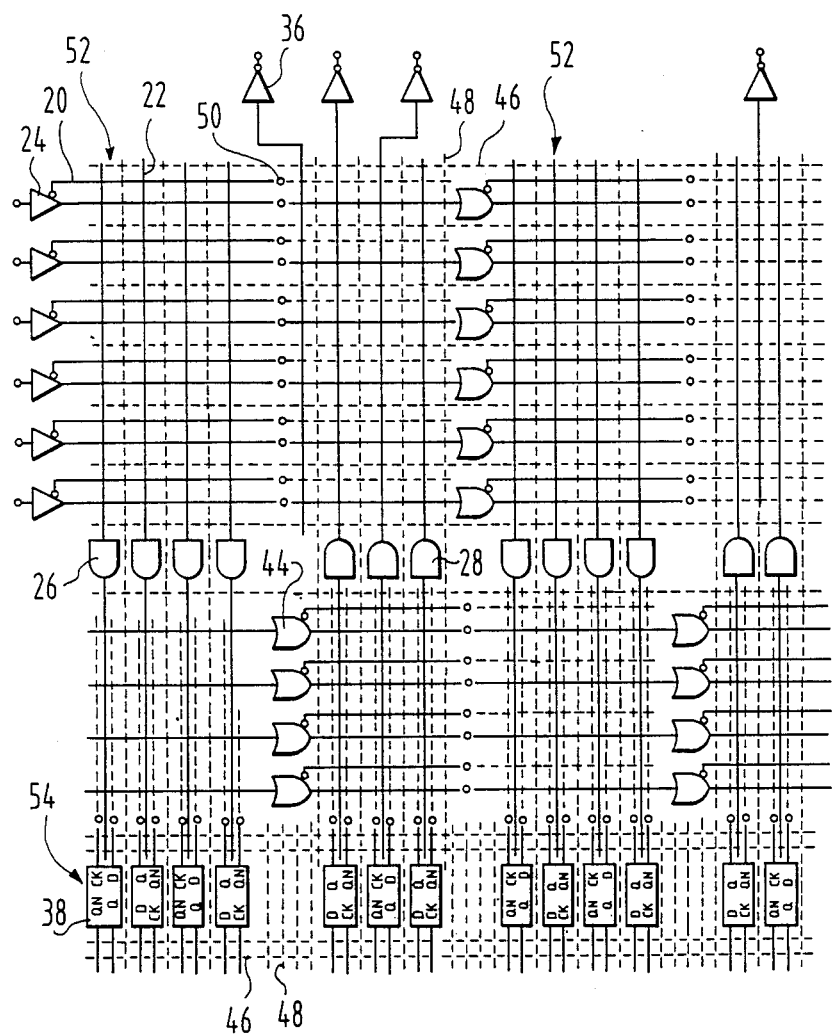

More features and benefits of this invention follow from the following description which, in combination with the attached diagrams, will illustrate the invention using some prototypes. They show:

FIG. 1: a schematic top view of a conductive path area, and the functional elements of a chip per this invention, FIG. 2: a schematic section of a linkage area, FIG. 3: a schematic presentation of an array consisting of six linkage areas per this invention, and FIG. 4: a schematic top view of one part of an array per FIG. 3.

In FIG. 1 and 4, an explicit presentation of the linking and connecting elements was intentionally omitted to improve clarity.

The structure presented in FIG. 1 is formed on a small silicon slice serving as a substrate, using a technology generally known in the manufacture of integrated circuits. The conductive path area presented in FIG. 1 encompasses a linkage area generally labeled with 10, with zones 12, 14, 16 and 18, of which, in the presented example, only zone 12 is presented in detail. Like zone 12, the zones 14, 16 and 18 can be configured per this invention or in conventional ways.

Zone 12 consists of intersecting conductive paths 20 or 22 shown with solid lines. At the cross-over points, the conductive paths 20 and 22 can be linked by known methods, using linking elements, as presented in the prototype shown in FIG. 2. In the example presented there, the logical status of conductive path L1 is dependent on the logical status of the conductive paths $K_x$ at the cross-over points of which linking elements are found. In the presented example, elements T2, T3 and T5 are activated, while the elements T1 and T4 are deactivated. Therefore, the NOR function $$L1 = K2 + K3 + K5$$

or the AND function $$L1 = K2 \cdot K3 \cdot K5$$

is executed.

It can be seen that the AND and OR operations can be transposed to each other through inversion.

Conductor paths 20 and 22 each lead to functional elements 24, 26, 28 and 30. The functional elements 24 are phase splitters, which are necessary to make inverted, as well as the non-inverted, input signals available for logical operations.

In the presented case, the functional elements 26 separate zone 12, in which the conductive paths 22 perform a WIRED-AND operation (see FIG. 2), from zone 14 of the linkage area 10 in which conductive paths 32, using linkage elements, execute control over conductive paths 34 which perform WIRED-OR operations.

The functional elements 36 located at the outputs of zone 18, serve as drivers for outputs that leave the integrated chip. As usual, the functional elements 24 and 36 are logically located at the edge of the substrate, because they are the connection to the outside and can be best contacted there. In addition, it leaves the layout of the conductive path area, or the linkage areas, open for an optimum layout.

Within zone 12 of linkage area 10, more functional elements 38 are arranged in a matrix pattern and regularly spaced. They are connected with conductive paths 40 or 42, which run parallel to conductive paths 20 and 22. The additional functional elements 38 arranged in adjacent rows or columns of the matrix, are preferably set in a staggered fashion, so that conductive paths 20, 22, 40, 42 can extend unobstructedly across a large portion of the conductive path area and, thereby, offer more direct linking possibilties. The functional elements 38 serve to increase the flexibility and effectivness of the entire arrangement. The input lines 40 of these functional elements 38 can be configured so that they perform logical operations like lines of a logic array. The output lines 42 control linking elements, as is the case with the functional elements 24. Candidates for functional elements 38 are mainly storage elements, perhaps with differing and/or also programmable functions, and also include exclusive OR gates, or multiplexers.

In order to further process these signals formed by the functional elements 38 as intended, it may be expedient to supply these signals in inerted and non-inverted forms. In a multi-level configuration per FIG. 1, it is recommended to also generate the outputs of the OR array, at least in part, in inverted and non-inverted forms, as is presented with the functional elements 44, which are connected to the conductive paths 34, between zones 14 and 16.

Between conductive paths 20 and 22, the conductive path area 10 has functionally free conductive paths 46, 48, shown by the dashed lines, which are not allocated to a specific functional element at the edge of the conductive path area and, therefore, readily available for the forming of the final integrated circuit. The free conductive paths 46, 48 are connected, via connecting elements, with at least one other conductive path 20, 22, 40, 42, 48, 46, so that their logical status is transmitted to the free conductive path. This free conductive path can now transmit this logical status to another conductive path 20, 22, 40, 42, 46, 48, because the cross-over point is equipped with a connecting element of the opposite working direction. In this way, the free conductive paths 46, 48 have a mere wiring function. If in place of, or in addition to the second connecting element, one or more linking elements at cross-over points with other conductive paths, are connected to the free conductive path 46, 48, thereby giving it a controlling function, the free conductive path assumes an active function. This is because the logical status of the conductive path that controls the free conductive path through the first-mentioned connecting element, can be transmitted to several other conductive paths in a fashion that allows execution of logical operations.

In the above described context, connecting elements are to be understood to also include unidirectional and bidirectional elements, transmission gates, inversion elements and drivers. The latter have a regenerating effect on the signal and, especially with long conductive paths, can increase the processing speed.

The functional elements 38 that are inserted in the linkage area, can be utilized even more effectively through the availibility of the free conductive paths 46, 48. For example, feedbacks are also simplified by this. In this way, storage elements within the linkage area can be wired into a counter chain, without blocking any linkage functions in the conductive path area.

Within the linkage area 10, the free conductive paths 46, 48 can be configured differently. This affects the routing of the conductive paths, the number and working direction of the connecting elements, and the number of linking elements, which have a linking effect on other conductive paths. Unlike with conventional conductive paths of a logic array, with free conductive paths 46, 48, it is not necessary to place a linking elements at each cross-over point, if a local nonuniformity of the arrangement is acceptable.

Due to the generally bidirectional operation of conductive paths, and the capability to select one of several conductive paths for the execution of a desired subfunction of a conductive path, it may be beneficial to waive the option of connecting every free conductive path 46, 48 to every crossing conductive path 20, 22, 40, 42, 46, 48. The same applies to linking elements which are activated by free conductive paths 46, 48. A staggered arrangement of connecting and linking elements, from one conductive path to the next will suffice. This arrangement results in a reduction of redundant connecting and linking elements and, thereby, the substrate surface area. This provides a substantial advantage, considering that for each programming station, a certain number of programming lines and decoders is required.

If a free conductive path can be selected from more than one connecting element, only one of these should be activated at a time, in order to avoid a collision. If limitations in flexibility are acceptable, the connections to the free conductive paths can be permanently preset.

To further increase the flexibility and effectiveness and, to eliminate redundancy as much as possible, conductive paths 20, 22, 40, 42, 46, 48 have interfacing points 50, located between two cross-over points, at which the respective conductive paths can be broken or, at which conductive path segments can be interconnected. Because of these interfacing points, especially in CMOS implementations, an additional gain in processing speed can result by the separation of unused portions of conductive paths.

Conductive path segments generated by the separation of conductive paths 20, 22, 40, 42, can also be used as free conductive path segments if they are equipped with at least one additional connecting element. Likewise, free conductive paths 46, 48 can be separated into several free conductive path segments. Through wise utilization of these conductive path segments, conductive paths can be used more effectively.

Depending on whether a conductive path is used unidirectionally or bidirectionally, different elements can be utilized to form interfacing points. With a bidirectional signal flow, fusible connections or transmission gates can be used, which can be programmed to be turned on or off. With a unidirectional signal flow as, for example, can be seen from the conductive paths 20, program-activated drivers or inverters can be applied at the interfacing points.

When conductive paths are segmented, it is possible that, depending on the type of interfacing point, the desired function, and the type of implementation, a so-called PULL-UP or PULL-DOWN element may have to be provided for each conductive path segment.

The arrangement of the interfacing points 50 represented in FIG. 1 illustrates how, through the use of these interfacing points, zone 12 of the linkage area 10 can be divided into smaller partially or totally independent sub-areas, again serving as linkage areas. In small zones it is advisable to arrange interfacing points in a staggered fashion, preferably diagonally, because the separation of multiple conductive paths should be correlated with the connecting points of conductive paths. These are, however, logically arranged parallel to the area diagonals, because the connection of a single conductive path to multiple other conductive paths is rarely required.

The division of a linkage area into several sub-areas becomes beneficial, for example, when multi-level logic is to be converted to a circuit. Also, the division provides the option of duplicating functional elements in one or more sub-areas.

The division of a large conductive path area into smaller linkage areas, can be incorporated in the chip per this invention, already during its design. For example, a configuration per FIG. 3 can serve this purpose. This requires linkage areas 52 to be meshed with each other, as well as with functional elements within block 54. The linkage areas 52 may be configured in the manner described in FIG. 1.

FIG. 4 shows a schematic presentation of a section of FIG. 3, in a special configuration of a linkage area 52 and a portion of the functional element block 54. The elements matching those in FIG. 1 were given the same reference symbols. For reasons of clarity, the interfacing points 50 were omitted from the free conductive paths 46, 48. As shown in FIGS. 3 and 4, individual linkage areas 52 can independently operate inputs and outputs. Individual linkage areas can be separated using the interfacing points 50. Thereby, the processing speed within a linkage area 52 can be increased.

As a result, the overall processing speed within the entire chip of a suitable design, can also be increased.

The degrees of freedom which result from this arrangement and through the use of the other features described, provide the logic array construction per this invention, with extremely great flexibility, which almost approaches that of gate array, and makes possible an effective minimization of the logic effort. Also, the programmability allows the on-site specification of the circuit by the user. The individual types of programming are known. Their interaction with the elements to be programmed depends on their implementation. Depending on which element is affected, one or the other type of programming can be beneficial, so that potentially, two or more types of programming can be mixed on one substrate.

As with conventional logic array chips, chips per this invention, also require that their configuration be determined before it is produced. Unlike with conventional chips, additional parameters must be considered here, such as the number, location and type of the additional functional elements 38, the interfacing points 50, and the free conductive paths 46, 48, for which also the number, location, type and working direction of their connecting and linking elements must be defined.

I claim:

1. In a logic array chip formed on a substrate having a centrally located area with a first grid pattern of conductive paths running in rows and columns, ends of the conductive paths of the first grid on the border of the central area being connected to functional elements, the array chip further including a plurality of first connecting elements at crossover points of the conductive paths capable of selectively physically connecting a path running in a row with a path running in a column in the first grid, wherein the improvement comprises:

a second grid pattern of conductive paths running in rows and columns adjacent to the conductive paths in the first grid, ends of the conductive paths in the second grid being free from connection to functional elements; and a second plurality of connecting elements located in said central area where conductive paths of the first and second grid cross over, said second connecting elements being adapted to selectively connect paths of the first grid to paths of the second grid.

2. The improvement of claim 1 which comprises:

a third grid of conductive paths running in rows and columns adjacent to the conductive paths of the first and second grids, paths of the third grid being connected to functional elements located within said central area.

3. The improvement of claim 2 wherein said functional elements in the third grid are staggered in the rows and columns thereof.

4. The improvement of claim 1 wherein at least one conductive path has at least one interfacing point located between cross over points, said interfacing point being capable of being broken to thereby open a given conductive path.

5. The improvement of claim 4 wherein each interfacing point can be programmably opened or closed.

6. The improvement of claim 4 wherein multiple interfacing points within said area are arranged in a matrix pattern.

7. The improvement of claim 1 wherein said connecting elements are selected from the group of fusible connections, transmission gates, drivers, inverters and transistors.

8. The improvement of claim 2 wherein said functional elements in the third grid are selected from the group of storage elements, exclusive OR gates, and multiplexers.

* * * * *